(12) United States Patent
Nayfeh et al.

(10) Patent No.: US 7,659,172 B2
(45) Date of Patent: Feb. 9, 2010

(54) STRUCTURE AND METHOD FOR REDUCING MILLER CAPACITANCE IN FIELD EFFECT TRANSISTORS

(75) Inventors: Hasan M. Nayfeh, Fishkill, NY (US); Andrew Waite, Hopewell Junction, NY (US)

(73) Assignees: International Business Machines Corporation, Armonk, NY (US); Advanced Micro Devices, Inc. (AMD), Sunnyvale, CA (US)

( * ) Notice: Subject to any disclaimer, the term of this patent is extended or adjusted under 35 U.S.C. 154(b) by 594 days.

(21) Appl. No.: 11/164,343

(22) Filed: Nov. 18, 2005

(65) Prior Publication Data

US 2007/0117334 A1    May 24, 2007

(51) Int. Cl.
*H01L 21/336* (2006.01)

(52) U.S. Cl. .............................. 438/300; 257/E21.431; 257/E21.415

(58) Field of Classification Search ........................ None
See application file for complete search history.

(56) References Cited

U.S. PATENT DOCUMENTS

| | | | |
|---|---|---|---|
| 6,407,427 B1 | 6/2002 | Oh | |
| 6,521,949 B2 | 2/2003 | Assaderaghi et al. | |
| 7,091,071 B2 * | 8/2006 | Thean et al. | 438/149 |
| 2002/0171107 A1 * | 11/2002 | Cheng et al. | 257/347 |
| 2004/0248369 A1 | 12/2004 | Wang et al. | |
| 2005/0121731 A1 | 6/2005 | Maszara | |
| 2005/0148147 A1 * | 7/2005 | Keating et al. | 438/299 |
| 2005/0151193 A1 | 7/2005 | Wong | |
| 2006/0115949 A1 * | 6/2006 | Zhang et al. | 438/300 |
| 2006/0228842 A1 * | 10/2006 | Zhang et al. | 438/184 |

FOREIGN PATENT DOCUMENTS

JP    5206455 A    8/1993

* cited by examiner

*Primary Examiner*—W. David Coleman
*Assistant Examiner*—Shaka Scarlett
(74) *Attorney, Agent, or Firm*—Cantor Colburn LLP; H. Daniel Schnurmann

(57) ABSTRACT

A method for forming a field effect transistor (FET) device includes forming a gate conductor and gate dielectric on an active device area of a semiconductor wafer, the semiconductor wafer including a buried insulator layer formed over a bulk substrate and a semiconductor-on-insulator layer initially formed over the buried insulator layer. Source and drain extensions are formed in the semiconductor-on-insulator layer, adjacent opposing sides of the gate conductor, and source and drain sidewall spacers are formed adjacent the gate conductor. Remaining portions of the semiconductor-on-insulator layer adjacent the sidewall spacers and are removed so as to expose portions of the buried insulator layer. The exposed portions of the buried insulator layer are removed so as to expose portions of the bulk substrate. A semiconductor layer is epitaxially grown on the exposed portions of the bulk substrate and the source and drain extensions, and source and drain implants are formed in the epitaxially grown layer.

4 Claims, 15 Drawing Sheets

STRUCTURE AND METHOD FOR REDUCING MILLER CAPACITANCE IN FIELD EFFECT TRANSISTORS

BACKGROUND

The present invention relates generally to semiconductor device processing techniques, and, more particularly, to a structure and method for reducing Miller capacitance in field effect transistors (FETs).

In the manufacture of semiconductor devices, there is a constant drive to increase the operating speed of certain integrated circuit devices such as microprocessors, memory devices, and the like. This drive is fueled by consumer demand for computers and other electronic devices that operate at increasingly greater speeds. As a result of the demand for increased speed, there has been a continual reduction in the size of semiconductor devices, such as transistors. For example, in a device such as a field effect transistor (FET), device parameters such as channel length, junction depth and gate dielectric thickness, to name a few, all continue to be scaled downward.

Generally speaking, the smaller the channel length of the FET, the faster the transistor will operate. Moreover, by reducing the size and/or scale of the components of a typical transistor, there is also an increase in the density and number of the transistors that may be produced on a given amount of wafer real estate, thus lowering the overall cost per transistor as well as the cost of integrated circuit devices incorporating such transistors.

Unfortunately, reducing the channel length of a transistor also increases "short channel" effects, as well as "edge effects" that are relatively unimportant in long channel transistors. One example of a short channel effect includes, among other aspects, an increased drain to source leakage current when the transistor is supposed to be in the "off" or non-conductive state, due to an enlarged depletion region relative to the shorter channel length. In addition, one of the edge effects that may also adversely influence transistor performance is what is known as Miller capacitance. In CMOS applications, the Miller capacitance is an amplification of a gate to drain capacitance primarily dominated by a parasitic overlap capacitance ($C_{ov}$) component. Overlap capacitance exists primarily as a result of the doped polycrystalline silicon gate electrode and gate dielectric that (almost invariably) overlaps with a conductive portion of the more heavily doped source/drain regions and/or the less heavily doped source/drain extension (SDE) regions (if present) of the FET. The relative contribution of the overlap capacitance to the overall device capacitance increases as the gate length is scaled down. For example, $C_{ov}$ can account for as much as 50% of the overall capacitance when a MOSFET has a scaled gate length of about 30 nanometers.

Accordingly, it would be desirable to be able to fabricate an FET that maintains a low series resistance between the gate and the drain and between the gate and the source of the device, while at the same time retaining beneficial short channel effects and minimizing the parasitic Miller capacitance formed by the drain overlap and/or the source overlap, depending on the device application.

SUMMARY

The foregoing discussed drawbacks and deficiencies of the prior art are overcome or alleviated by a method for forming a field effect transistor (FET) device. In an exemplary embodiment, the method includes gate conductor and gate dielectric on an active device area of a semiconductor wafer, the semiconductor wafer including a buried insulator layer formed over a bulk substrate and a semiconductor-on-insulator layer initially formed over the buried insulator layer. Source and drain extensions are formed in the semiconductor-on-insulator layer, adjacent opposing sides of the gate conductor, and source and drain sidewall spacers are formed adjacent the gate conductor. Remaining portions of the semiconductor-on-insulator layer adjacent the sidewall spacers and are removed so as to expose portions of the buried insulator layer. The exposed portions of the buried insulator layer are removed so as to expose portions of the bulk substrate. A semiconductor layer is epitaxially grown on the exposed portions of the bulk substrate and the source and drain extensions, and source and drain implants are formed in the epitaxially grown layer.

In another embodiment, a field effect transistor (FET) device includes a gate conductor and gate dielectric formed over a semiconductor-on-insulator layer, source and drain sidewall spacers formed adjacent the gate conductor, source and drain extensions formed within the semiconductor-on-insulator layer and beneath the source and drain sidewall spacers, a buried insulator structure upon which the semiconductor-on-insulator layer is formed, and doped source and drain regions formed adjacent to opposing sidewalls of the buried insulator structure, with at least a portion of the doped source and drain regions disposed below the source and drain extensions. The doped source and drain regions have a thickness sufficient for silicide contact formation therein.

BRIEF DESCRIPTION OF THE DRAWINGS

Referring to the exemplary drawings wherein like elements are numbered alike in the several Figures.

DETAILED DESCRIPTION

Disclosed herein is a method and structure for reducing parasitic Miller capacitance in fully depleted field effect transistors (FETs), in which a buried source/drain MOSFET is created by removing portions of a buried insulator (e.g., oxide) layer corresponding to the source/drain locations and growing an epitaxial layer (e.g., silicon) on the exposed bulk material. This creates sufficient silicon thickness for silicidation of the source/drain contacts without the need for raised source/drain structures that have increased Miller capacitance.

Figure 1:
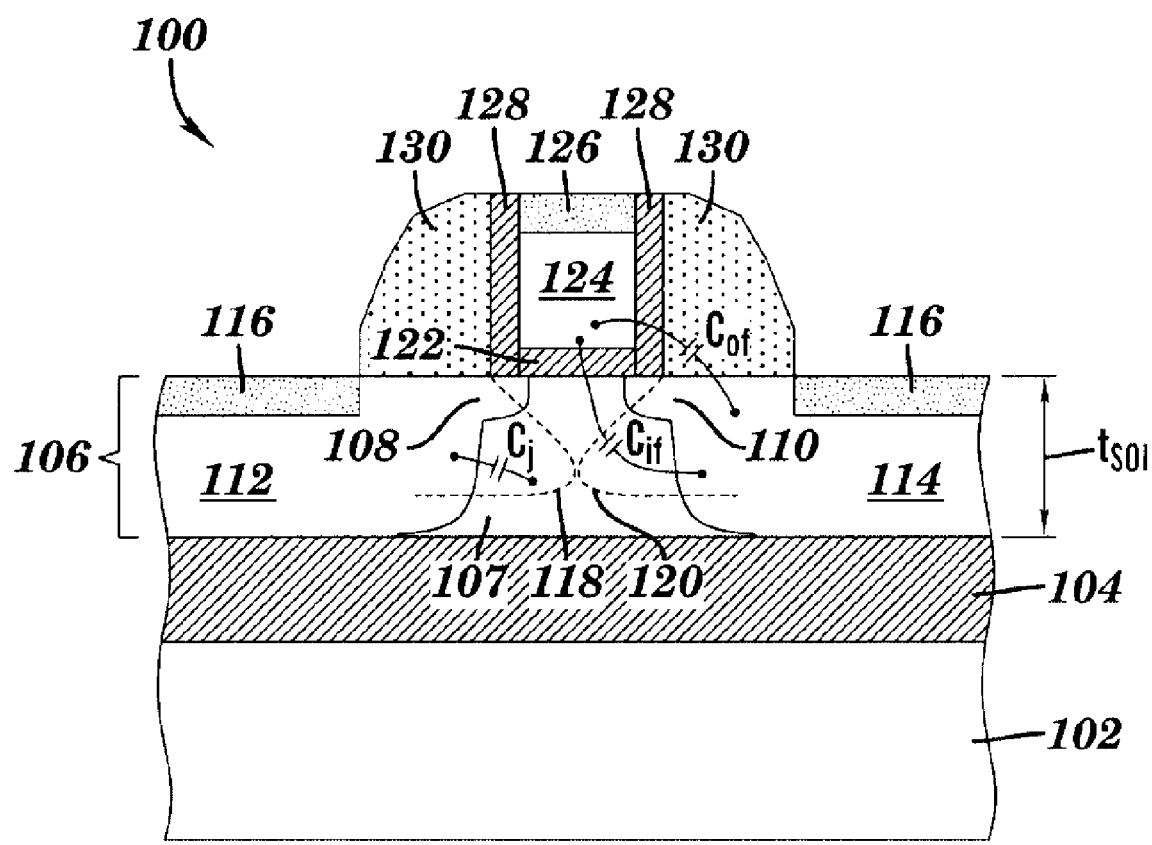
FIG. 1 is a cross sectional view of a conventionally formed MOS transistor schematically illustrating various components of parasitic capacitance.

Referring initially to FIG. 1, there is shown a cross sectional view of one type of conventional silicon-on-insulator (SOI) MOS transistor 100, in which a bulk substrate 102 (e.g., silicon) has a buried oxide layer (BOX) 104 formed thereon.

Formed over the BOX layer 104 is a thin layer of silicon 106 (i.e., the SOI layer) in which the active transistor device is defined. As is known in the art, one advantage associated with SOI devices is reduced junction capacitance, as the majority of the bulk silicon is isolated from the body 107 of the active transistor through the BOX layer 104.

The scaled down MOSFET 100, having submicron or nanometer dimensions, includes a source extension 108 and a drain extension 110 formed within an active device area of the SOI layer 106. For this particular configuration of SOI FET, the total thickness of the SOI layer 106 ($t_{SOI}$) may be on the order of about 20 nanometers (nm) to about 150 nm. The source extension 108 and the drain extension 110 are shallow doped junctions designed to minimize short channel effects in the MOSFET 100 having submicron or nanometer dimensions, as known to one of ordinary skill in the art of integrated circuit fabrication.

The MOSFET 100 further includes a deep source doping region 112 and a deep drain doping region 114, each having silicide regions 116 for providing contact to the source and drain of the MOSFET 100. In addition, the SOI MOSFET 100 may include angled halo implant regions 118, 120 on the source and drain sides of the device (for further reducing short channel effects), wherein the halo implant regions have an opposite polarity dopant with respect to the deep source and drain regions 112, 114. In other words, for an n-type transistor, the deep source and drain regions are doped with an n-type dopant, while the halo implants comprise a p-type dopant.

As further illustrated in FIG. 1, MOSFET 100 includes a gate dielectric 122 (e.g., an oxide) and a gate structure 124 formed thereon, which may be a polysilicon material, for example. As is the case with the source and drain regions, a gate silicide 126 is formed on the polysilicon gate 124 for providing low resistance contact thereto. A thin (offset) spacer 128 is also disposed on the sidewalls of the polysilicon gate 124 and gate oxide 122, and may also be an oxide material that acts as a buffer liner for nitride spacers 130.

In such a device, parasitic capacitance components are present. For example, in a typical CMOS application, the gate to drain capacitance is typically amplified with respect to the gate to source capacitance due to the Miller effect since the source potential is generally fixed (e.g., an NFET source coupled to a logic low potential, and a PFET source coupled to a logic high potential). On the other hand, the voltage of the drain of a CMOS device is also subject to change at the same time the gate voltage changes, thus resulting in the amplified Miller effect. As shown in FIG. 1, one component of the overall gate to drain capacitance results from the "outer fringe" capacitance ($C_{of}$) defined by the sidewall of the gate conductor 124 on the drain side, the dielectric of the spacer material 128, 130, and the drain extension 110.

In addition, an "inner fringe" capacitance ($C_{if}$) is defined by the bottom of the gate conductor 124, the transistor body 107, and the deep drain region 114. However, this component of parasitic capacitance is primarily present at gate voltages less than or equal to the threshold voltage ($V_T$) of the device. Once the gate voltage reaches and exceeds $V_T$, the inversion charge in the channel isolates the body and deep drain region from the gate 124, rendering $C_{if}$ mostly insignificant. Another component of gate to drain capacitance (and typically the most significant for scaled down devices) is the overlap capacitance of the drain extension region 110 beneath the gate conductor 124 and gate oxide 122, as indicated above. Still another component that can contribute to gate to drain capacitance results from via studs (not shown) that connect the silicide contacts 116 to upper wiring levels of the device.

On the whole, the individual components of gate to drain capacitance (and thus Miller capacitance for a CMOS application) of the MOSFET 100 of FIG. 1 are generally acceptable for desired device performance. On the other hand, improved short channel effects for a scaled down device of the type shown in FIG. 1 are more likely realized through, for example, halo implants 118, 120. However, a higher dopant concentration of the halo implants will increase the junction capacitance and reduce the breakdown voltage of the device.

Figure 2:
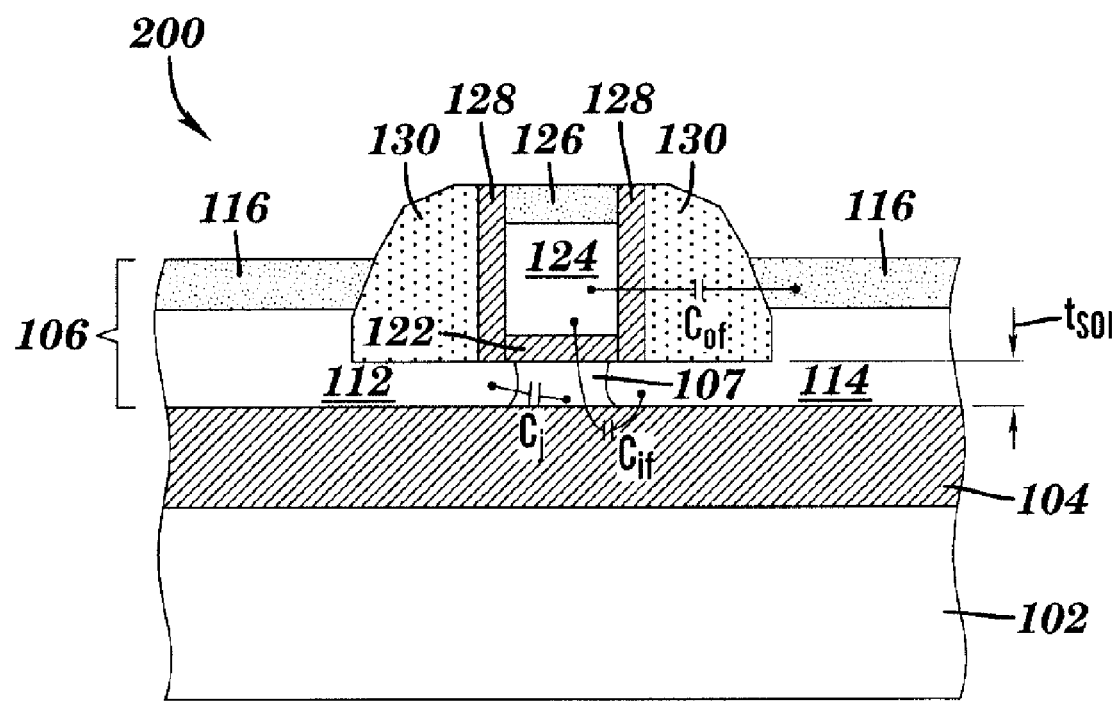
FIG. 2 is a cross sectional view of an alternatively proposed, ultra thin SOI MOS transistor (with raised source and drain) schematically illustrating various components of parasitic capacitance.

FIG. 2 is a cross sectional view of another previously proposed SOI MOSFET design 200, aimed at improving short channel effects. As can be seen, the raised source/drain MOSFET 200 of FIG. 2 is characterized by an ultra thin SOI body thickness (e.g., on the order of about 3 nm to about 30 nm in thickness), which is also referred to as a fully depleted SOI device as opposed to the partially depleted SOI device of FIG. 1. While such a configuration offers an improvement in short channel effects with respect to the device of FIG. 1, there is an overall increase in the parasitic capacitance effects in the configuration of FIG. 2.

On one hand, the junction capacitance of the MOSFET 200 is reduced with respect to that of FIG. 1, due to the reduced body thickness and absence of halo implantations. Along the same lines, the "inner fringe" capacitance ($C_{if}$) is also reduced because there is a reduced drain perimeter associated with the reduced body thickness. However, this is more than offset by an increased "outer fringe" capacitance ($C_{of}$) as a result of the raised source/drain configuration of MOSFET 200. In order to prevent a decrease in series resistance from an ultra thin silicon/silicide contact regions, additional silicon and silicide thickness is present adjacent the nitride spacers 130. This therefore increases the value of $C_{of}$ with respect to FIG. 1, and to an extent that surpasses the decrease in $C_{of}$ and $C_j$.

Accordingly, FIGS. 3(a) through 3(j) illustrate an exemplary process flow for forming a buried source/drain MOSFET, in accordance with an embodiment of the invention. Although the embodiments presented herein are described in terms of ultrathin SOI devices, it will be appreciated that the methodology and structures disclosed are also applicable to various types of semiconductor bulk substrates, buried insulator materials and active device semiconductor materials, as well as thicknesses thereof.

Figure 3A:
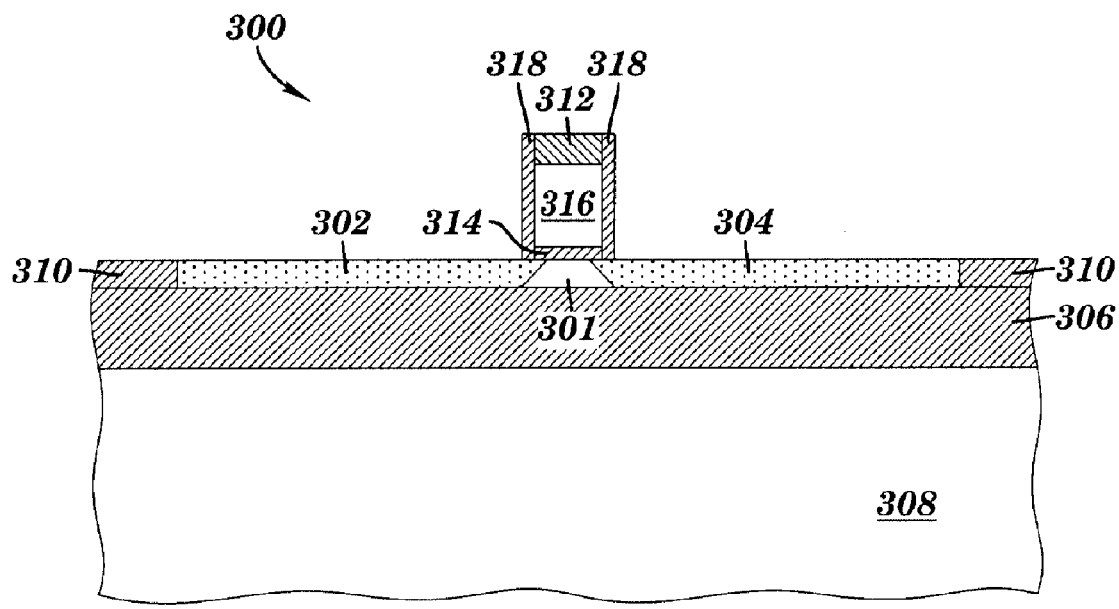
FIGS. 3(a) through 3(j) illustrate an exemplary process flow for forming a buried source/drain MOSFET, in accordance with an embodiment of the invention.

In FIG. 3(a), the device is processed up to the point following source drain/extension implantation, but before source/drain spacer formation. For the MOSFET device 300 (having a fully depleted channel 301), the source extension 302 and drain extension 304 are formed within an ultrathin silicon layer disposed above a buried oxide layer (BOX) 306. As will also be recognized from an ultrathin SOI device, the BOX layer 306 is formed over a bulk silicon region 308 of the carrier wafer. Shallow trench isolation (STI) regions 310 (e.g., oxide) isolate the FET from neighboring devices.

With the exception of a sacrificial silicon nitride cap 312, the formation of the gate and source/drain extension implants may follow conventional device processing, including the gate oxide 314, gate electrode 316 (e.g., polysilicon), and the offset spacers 318 used to define the source and drain extensions 302, 304. The functions of the nitride cap 312, which may be patterned and etched during the gate electrode formation, will become more evident hereinafter.

Figure 3B:
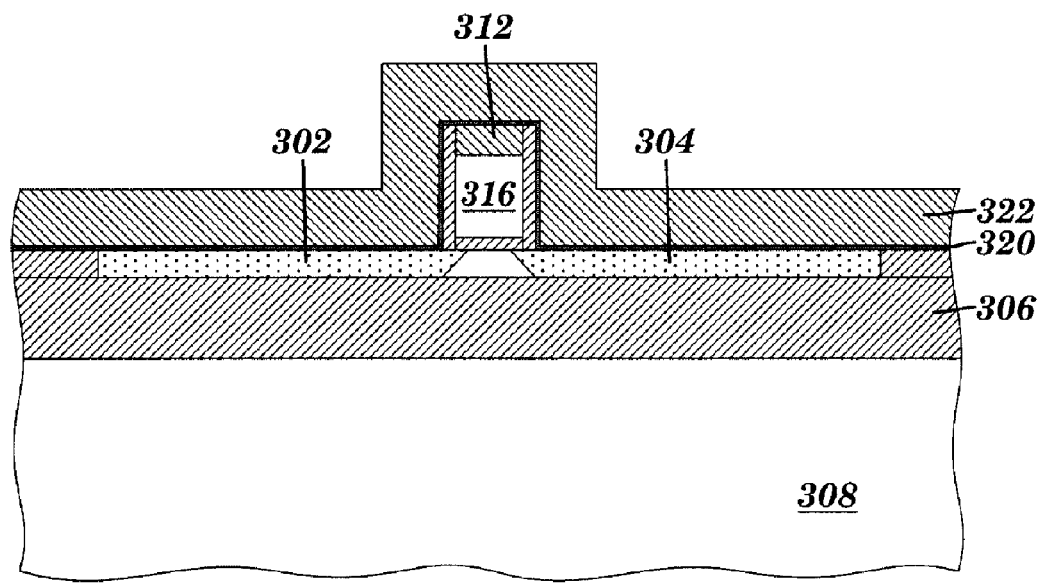
Figure 3C:
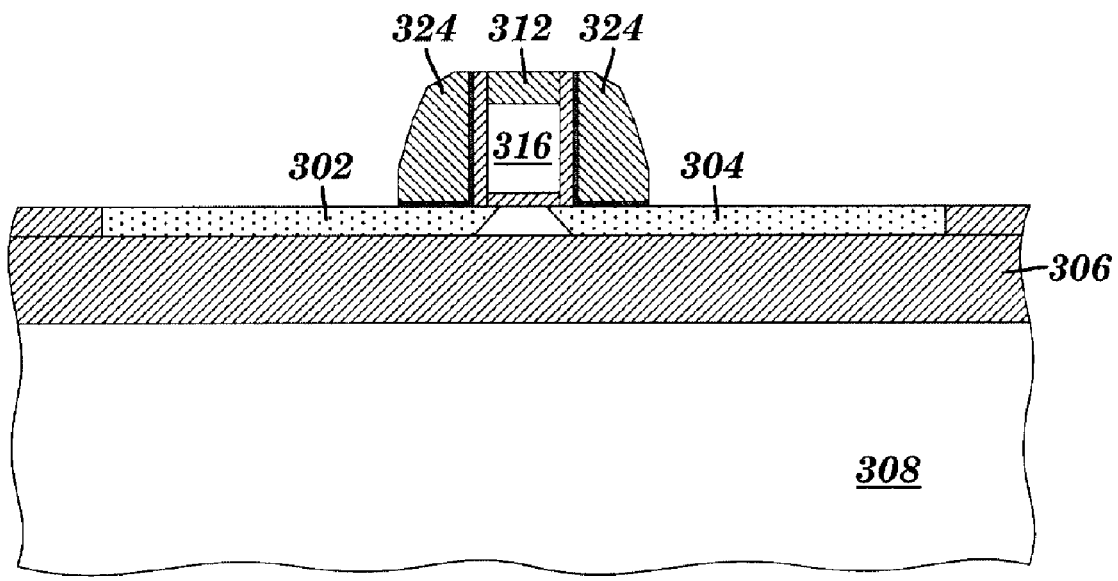
Figure 3D:
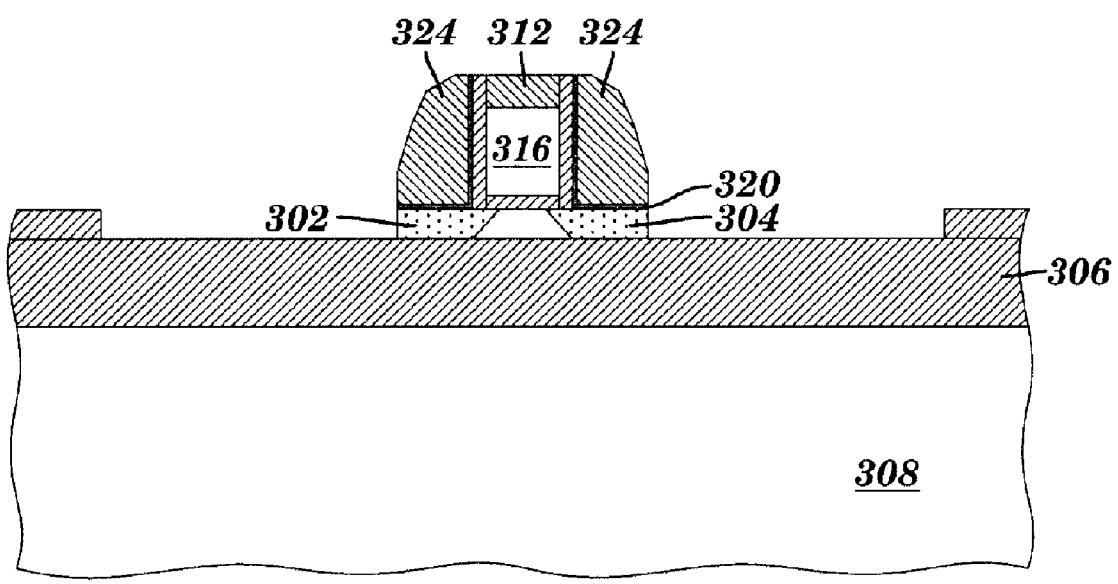

As shown in FIG. 3(b), layers used in the creation of source/drain sidewall spacers are formed over the device. These may include, for example, a spacer liner layer 320 and a spacer layer 322 (e.g., silicon nitride). The layers 320, 322 are then patterned and etched so as to form the source/drain sidewall spacers 324, as shown in FIG. 3(c). Then, as shown in FIG. 3(d), the doped silicon present in the source/drain locations is removed so as to expose a corresponding portion of the BOX layer 306 therebeneath, leaving only the source extension 302 and drain extension 304 (protected from etching by the source/drain sidewall spacers 324 and liner layer 320. During this silicon removal, the silicon nitride cap 312 also protects the gate electrode 316.

Figure 3E:
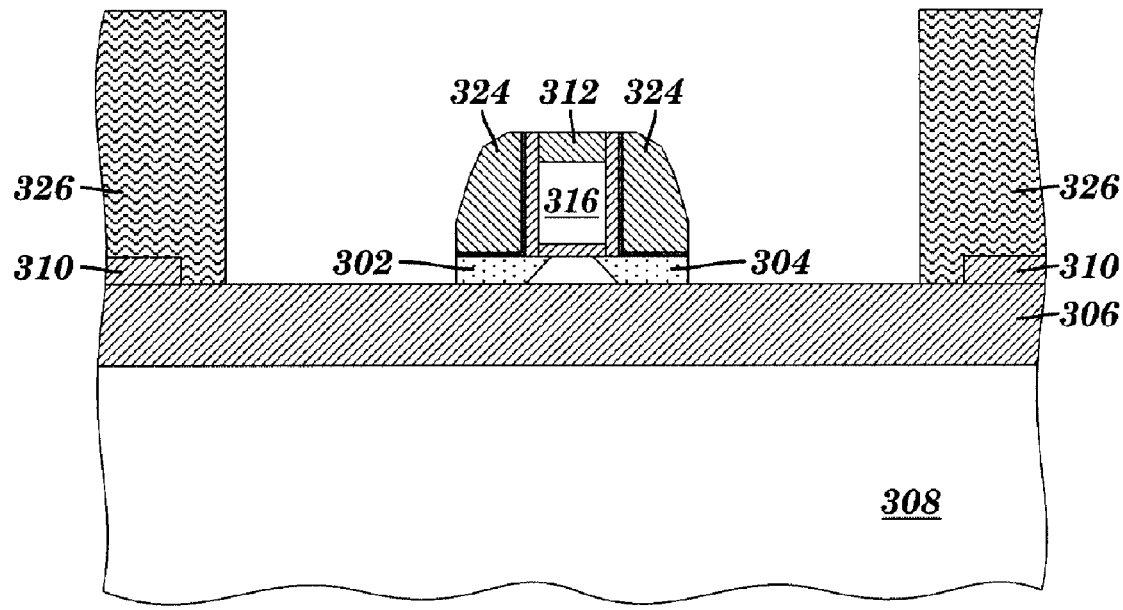
Figure 3F:
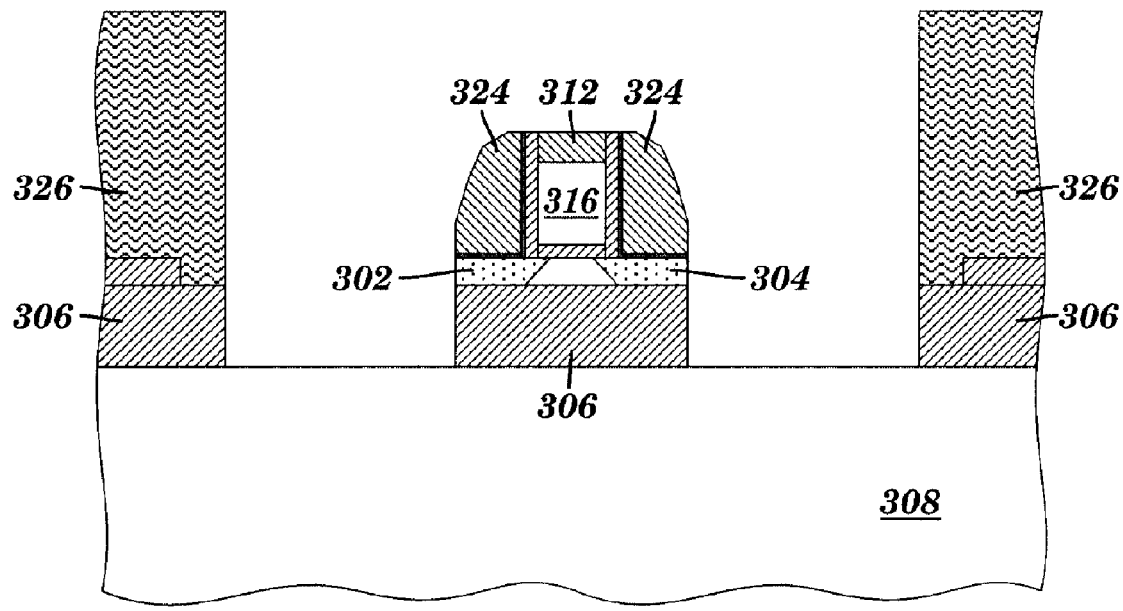
Figure 3G:
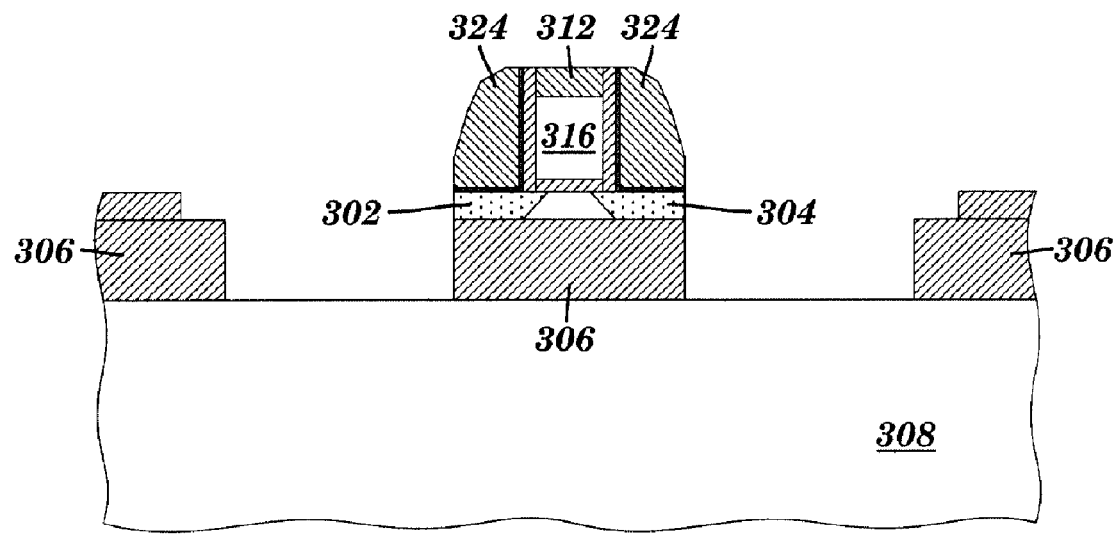

In FIG. 3(e), a photoresist layer 326 is patterned over the device to expose the BOX layer 306 corresponding to the buried source/drain formation, as well as to protect STI regions 310. The exposed BOX regions are then removed so as to expose the bulk silicon layer 308, as shown in FIG. 3(f). This step may be implemented, for example, through a dry etch process. Once the substrate is exposed, it may be optionally implanted in order to engineer the substrate with a dopant of a desired type. Then, the resist layer is removed, as shown in FIG. 3(g).

Figure 3H:
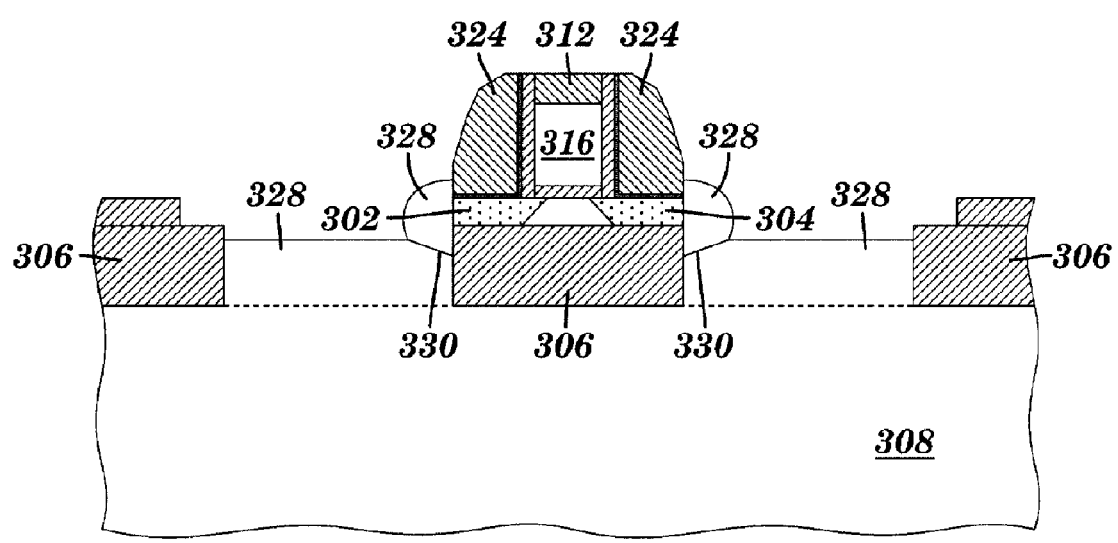

Referring now to FIG. 3(h), a selective epitaxial silicon layer 328 is grown on the exposed silicon portions of the device (the dashed line indicative of the original top surface of the bulk layer 308). Again, although the exemplary embodiments disclosed herein illustrate silicon as the epitaxial material, it will be appreciated that other materials can be epitaxially grown on the bulk substrate including, for example, silicon germanium (SiGe), silicon carbon (SiC), silicon germanium carbon (SiGeC), germanium (Ge), as well as combinations thereof.

Figure 3I:
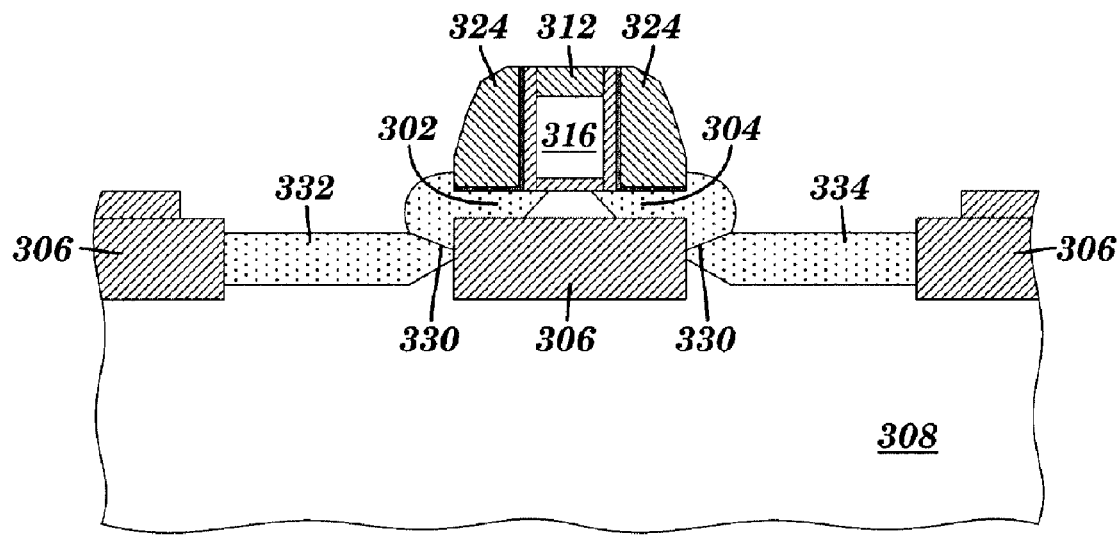

In terms of the FET device, the exposed silicon is located only at the bulk silicon regions 308 corresponding to the source/drain of the FET, and the source/drain extensions 302, 304. A crystal seam 330 occurs where the selective epitaxial silicon nucleating on the bulk silicon 308 meets the selective epitaxial silicon nucleating on the source/drain extensions 302, 304. As shown in FIG. 3(i), the source and drain regions 332, 334 are implanted, thereby resulting in a "buried source/drain" device that has sufficient silicon thickness for contact silicidation. Moreover, since this source/drain silicon thickness is adjacent the remaining portion of the BOX layer 306 beneath the gate, the Miller capacitance problems associated with a fully depleted, raised source/drain FET are avoided.

Figure 3J:
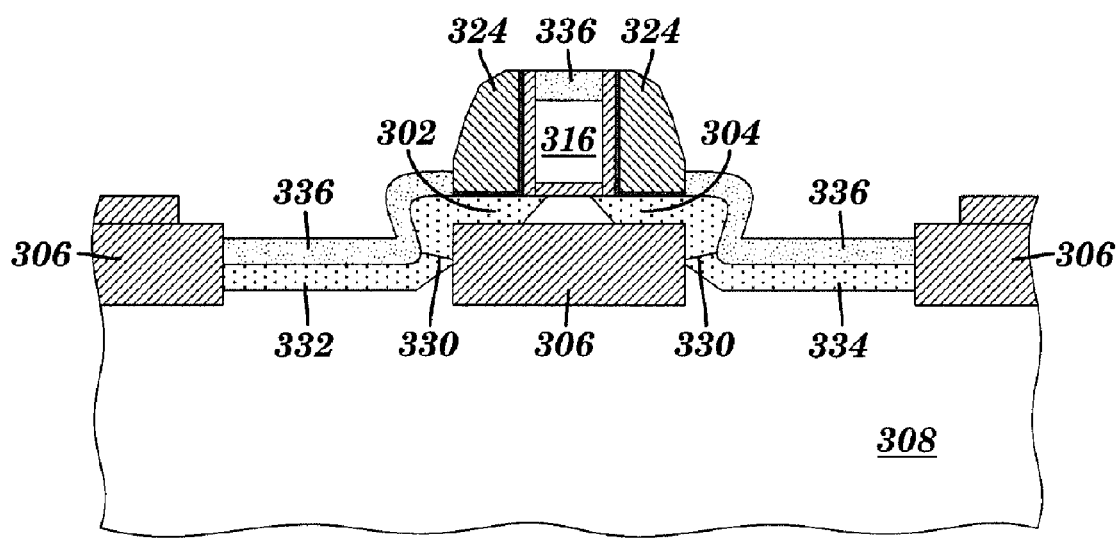

Finally, in FIG. 3(j), the nitride cap 312 atop the gate electrode is removed (e.g., by RIE) and the source and drain implants are activated by a rapid thermal anneal. The silicide contacts 336 for the source, drain and gate are then formed in a suitable manner known in the art. The silicidation of the source and drain regions also shunts the seams 330 created by the epitaxial growth process.

Figure 4A:
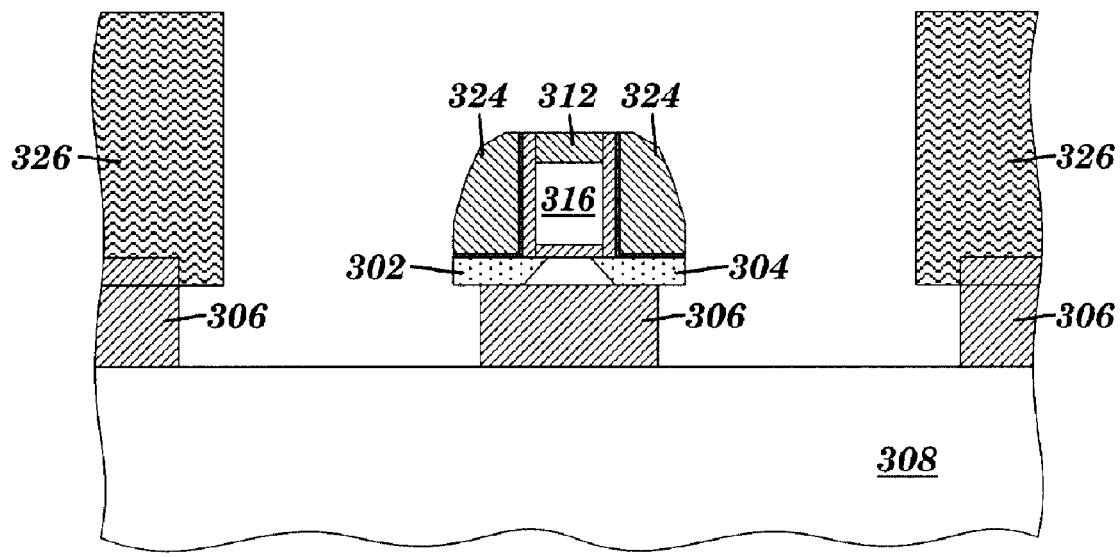
FIGS. 4(a) through 4(e) illustrate an alternative embodiment of the buried source/drain formation process, following the processing step shown in FIG. 3(f)

FIGS. 4(a) through 4(e) illustrate an alternative embodiment of the buried source/drain formation process described above. In this embodiment, the steps shown in FIGS. 3(a) through 3(e) are carried out as before. However, before removing the photoresist layer 326 after the initial BOX layer etch, another (sidewall) etch of the BOX material is performed as shown in FIG. 4(a). This additional etch (which may be a dry etch or a wet etch) is designed to remove a portion of the remaining BOX layer 306 beneath the sidewall spacers 324 and source/drain extensions 302, 304. Essentially, the BOX layer 306 beneath the gate in the embodiment of FIG. 4(a) is shorter in length than that of FIG. 3(f). Again, at this point, the exposed bulk silicon 308 may be implanted to change the dopant type thereof.

Figure 4B:
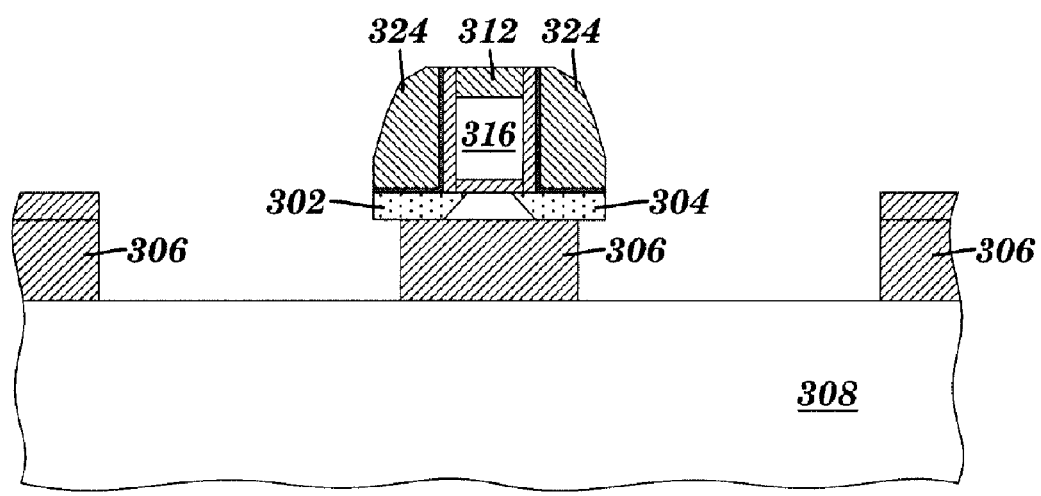
Figure 4C:
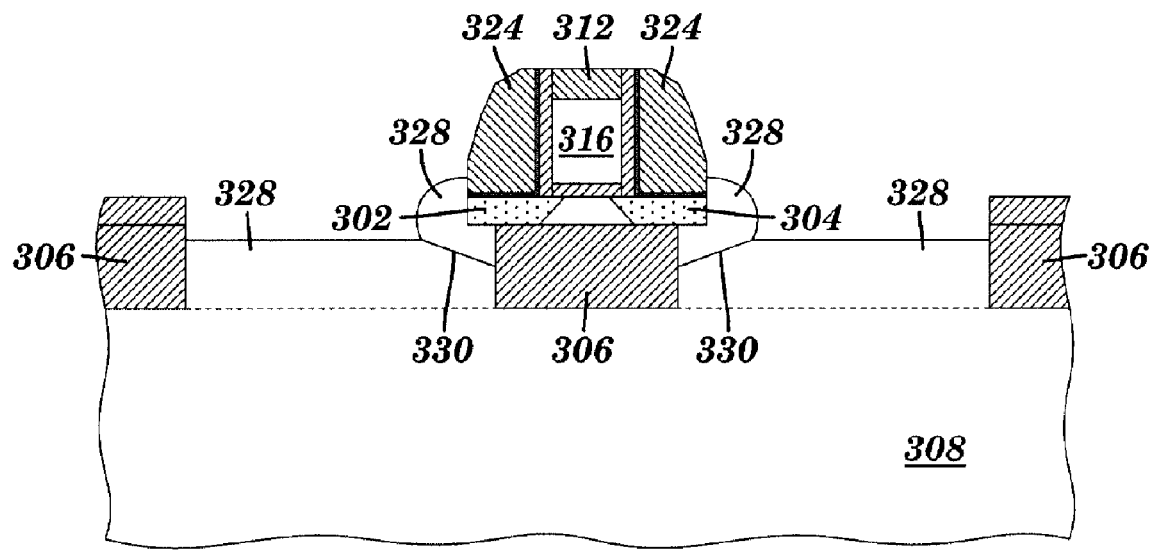
Figure 4D:
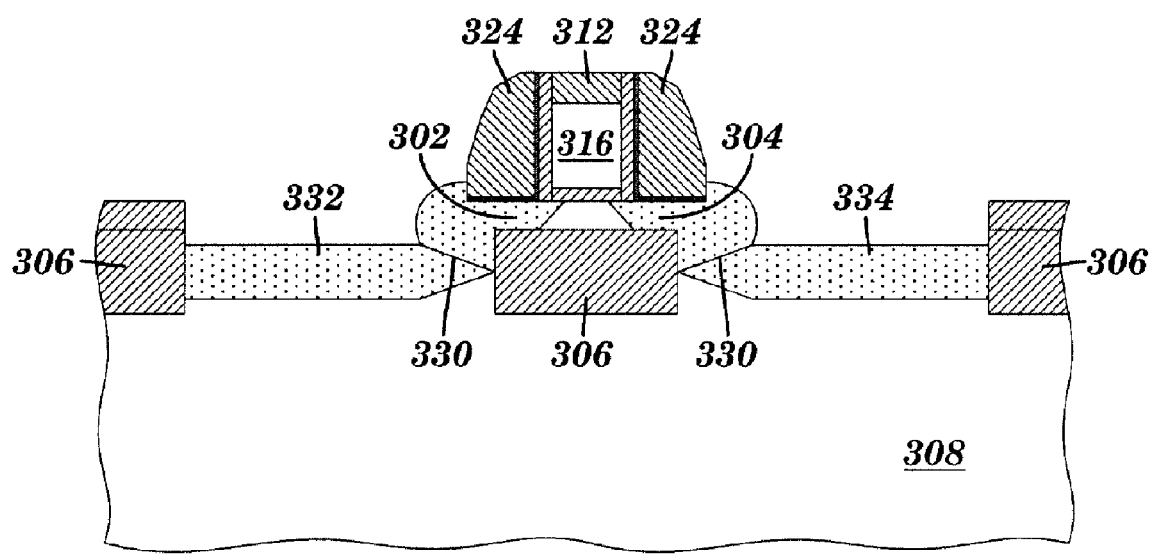
Figure 4E:
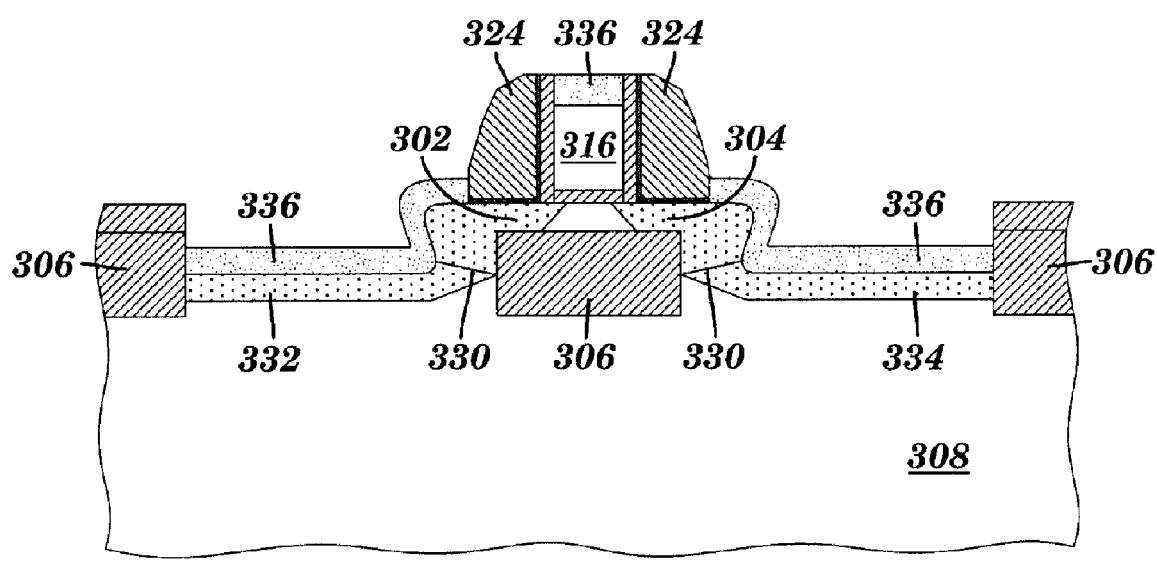

Following the additional BOX etch, the resist layer is stripped as shown in FIG. 4(b), and a selective epitaxial layer 328 is grown on the exposed silicon of the device in FIG. 4(c). As is the case with the previous embodiment, the epitaxial silicon layer 328 is formed on the bulk silicon regions 308 corresponding to the source/drain of the FET, and the source/drain extensions 302, 304. The gate electrode 316, being encapsulated by silicon nitride, does not have any epitaxial silicon grown thereon. Then, in FIG. 4(d), the source/drain regions 332, 334 are implanted. As compared to the embodiment of FIGS. 3(i) and 3(j), the reduced length BOX 306 of FIG. 4(d) provides for an increased width/decreased resistance of the doped source/drain epitaxial silicon, and thus brings the same into closer proximity to the channel region beneath the gate. The silicidation of the gate, source and drain contacts 336 (following rapid thermal processing to activate the source/drain implants, and nitride cap removal) is shown in FIG. 4(e). Again, the seams 330 created during the epitaxial silicon growth are shunted by silicidation.

Figure 5A:
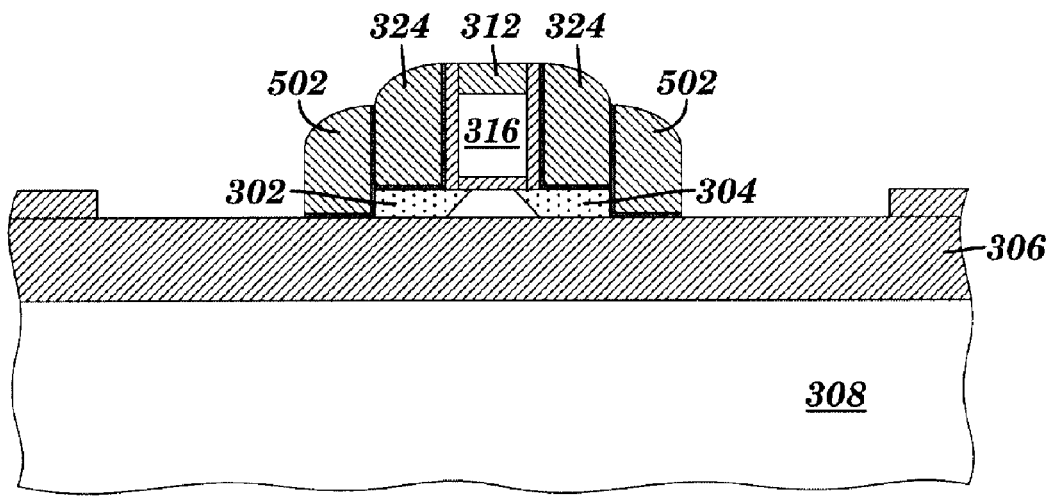
FIGS. 5(a) through 5(i) illustrate still an alternative embodiment of the buried source/drain formation process, following the processing step shown in FIG. 3(d).

Still another embodiment for forming a buried source/drain FET is shown in FIGS. 5(a) through 5(i). In this embodiment, the steps shown in FIGS. 3(a) through 3(d) are carried out as before. That is, the ultrathin silicon is removed to expose the BOX layer 306, leaving only the source and drain extensions 302, 304 beneath the sidewall spacers 324. However, prior to applying a patterned photoresist layer for the selective BOX removal, FIG. 5(a) illustrates the formation of another set of spacers 502, such as a silicon dioxide or silicon nitride material (and associated liner) adjacent the sidewall spacers 324. As will be shown below, the additional spacers 502 will serve to protect the outer sidewalls of the source and drain extensions 302, 304 from exposure during epitaxial silicon growth, thus preventing nucleation on the sidewalls. This, in turn, will facilitate an improved, smoother silicide profile with lower resistance and greater yield.

Figure 5B:
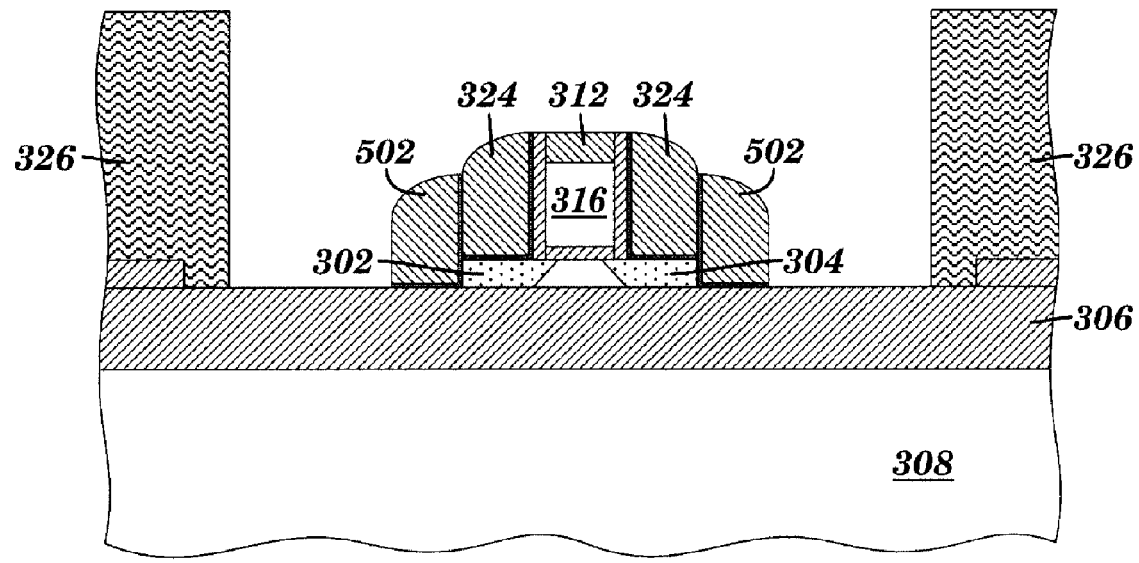
Figure 5C:
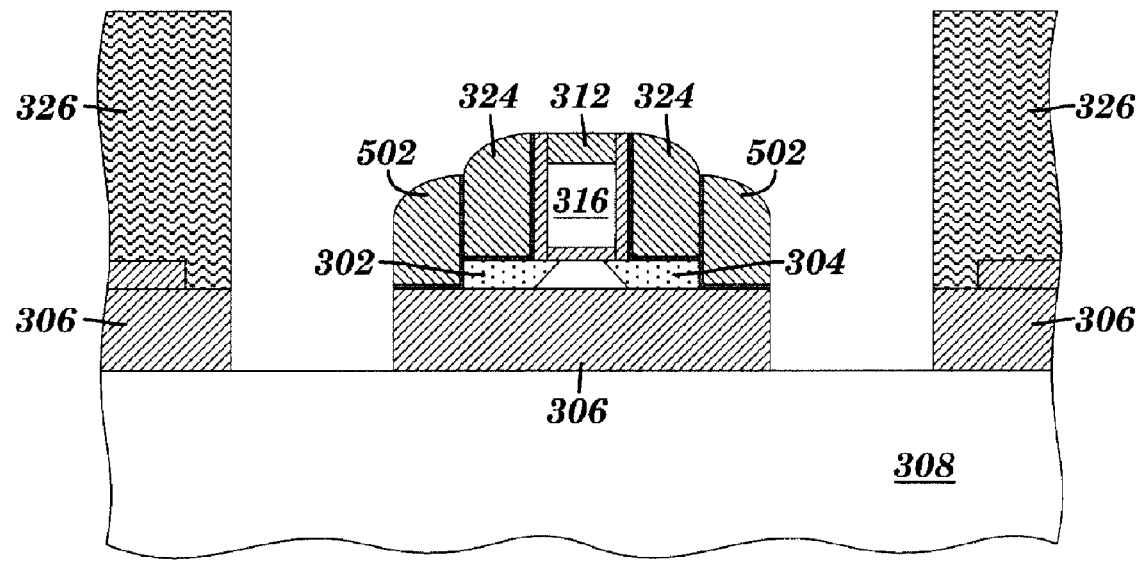
Figure 5D:
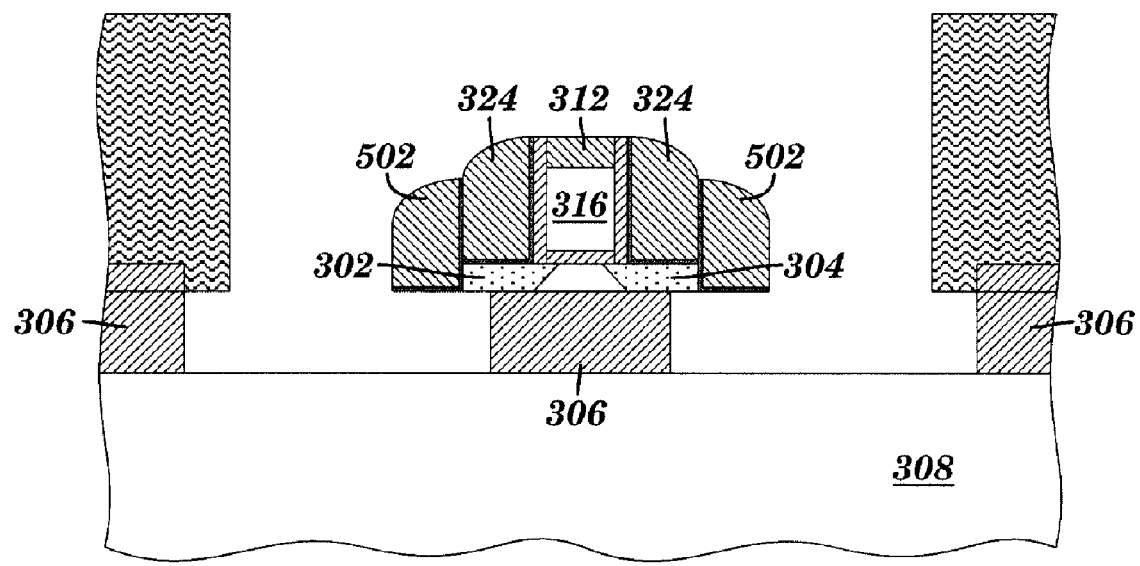

Following the formation of additional spacers 502, FIG. 5(b) illustrates the patterning of photoresist layer 326 in preparation of the BOX recess. In FIG. 5(c), the exposed BOX layer 306 is vertically etched (e.g., with a dry RIE etch) to expose the bulk silicon 308. As with the previous embodiments, an implant step can be performed at this point to engineer the dopant type of the substrate. Proceeding to FIG. 5(d), a horizontal etch is used to remove additional BOX sidewall material (as was done for the previous embodiment) to reduce the length of the BOX 306 beneath the gate. It will also be noted that the bulk substrate 308 could also be doped following this step.

Figure 5E:
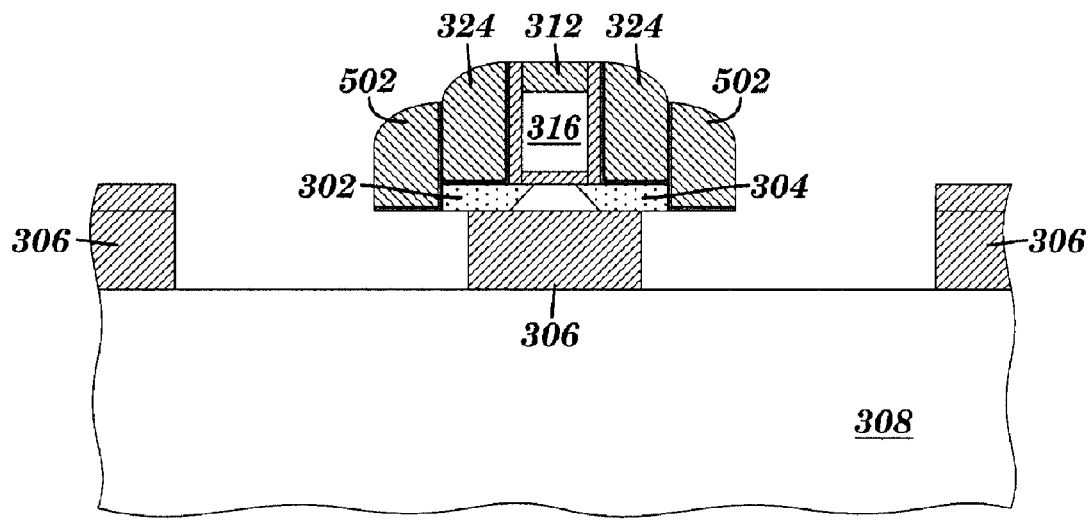
Figure 5F:
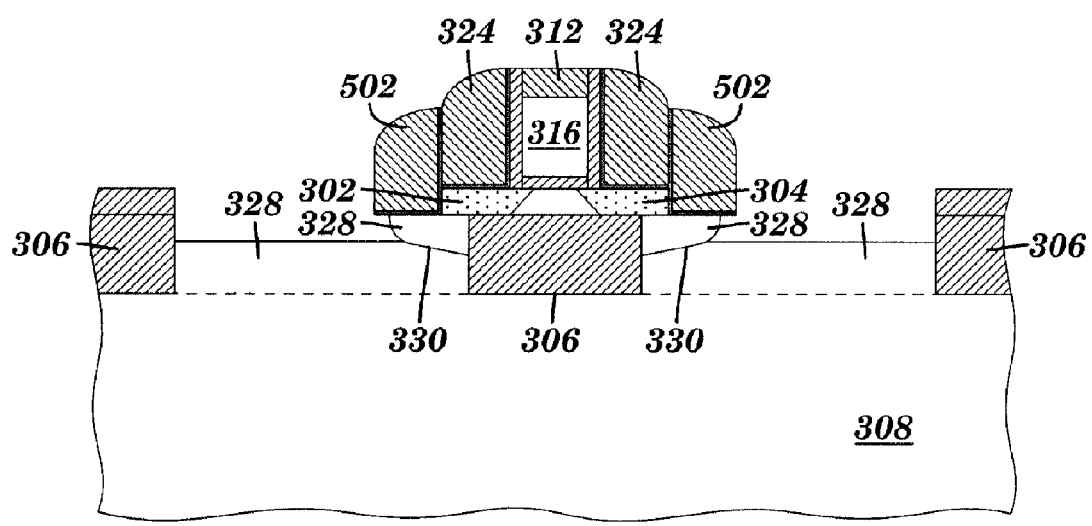
Figure 5G:
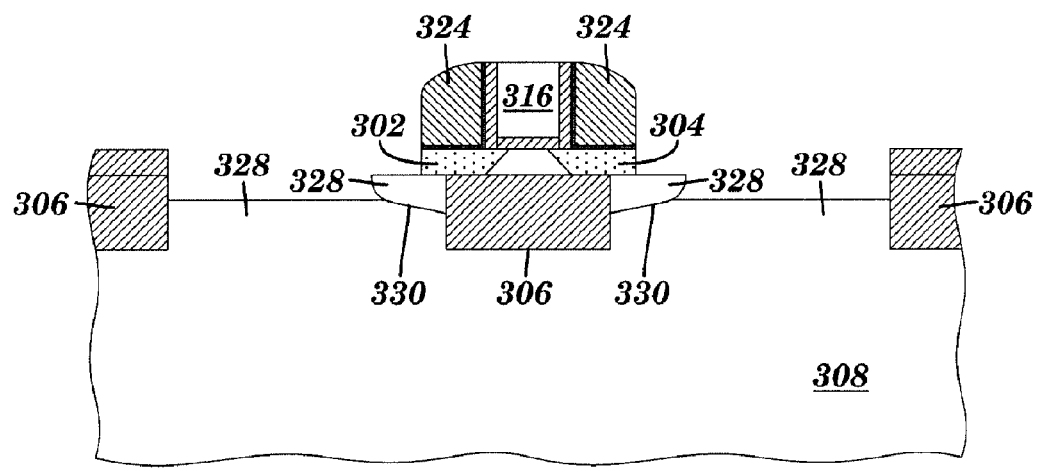
Figure 5H:
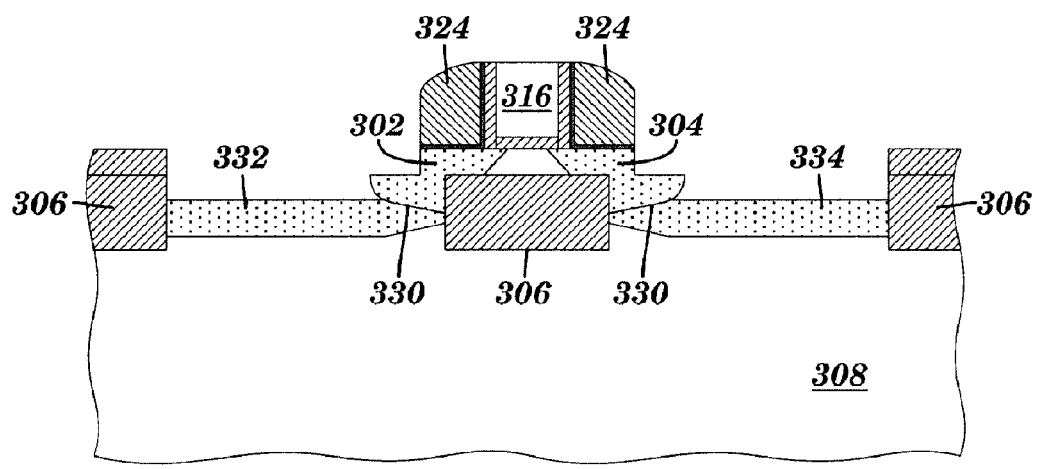

In FIG. 5(e), the resist layer is stripped, and in FIG. 5(f), a selective epitaxial layer 328 is grown on the exposed silicon, including the bulk silicon 308 and the bottom surfaces of the source/drain extensions 302, 304. A crystal seam 330 is again formed from selective epitaxial silicon nucleating on the bulk silicon 308 meeting the selective epitaxial silicon nucleating on the source/drain extensions 302, 304. At this point, the additional spacers 502 and nitride cap 312 are removed through a dry RIE etch, as shown in FIG. 5(g). Then, the source and drain regions are implanted as shown in FIG. 5(h), and thereafter activated to diffuse the dopants therein.

Figure 5I:
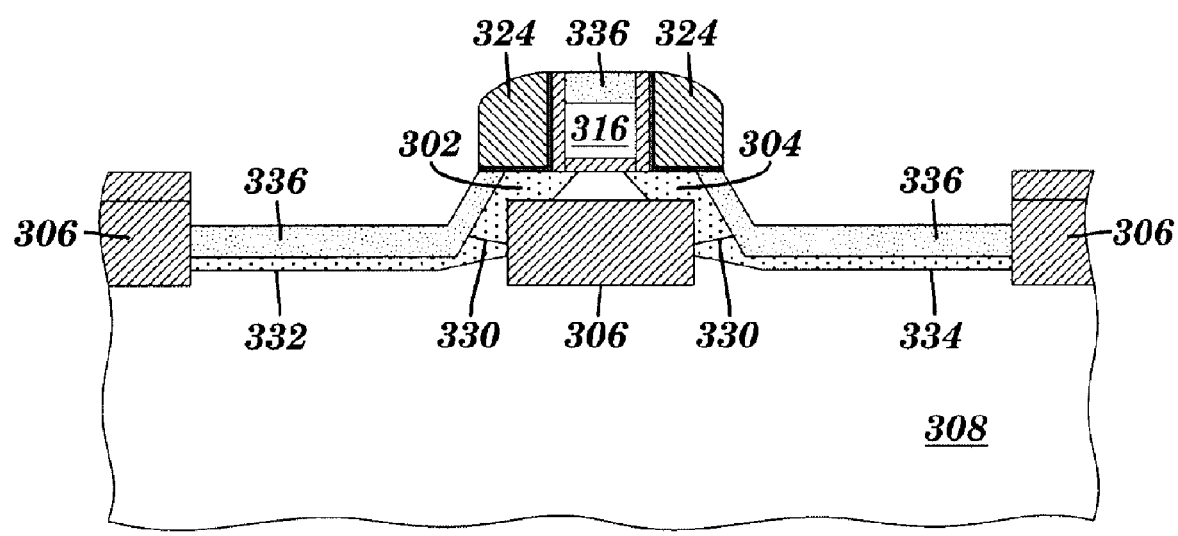

Finally, in FIG. 5(i), the gate, source and drain contacts 336 are silicided, shunting the seams 330 created during the epitaxial silicon growth. As can be seen from FIG. 5(i), the small, thinner protrusions initially formed during the epi-growth are consumed (i.e., converted to silicide) during the silicidation process. Moreover, this smoother profile also brings the sloped portion of the silicide contacts 336 of the source and drain in closer proximity to the channel than with respect to the earlier embodiments. Particularly, it will be observed that the source/drain silicide contacts meet with the spacers 324 at the bottom portions of the spacers, instead of with the sides of the spacers 324 as in the embodiments of FIGS. 3(j) and 4(e).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a field effect transistor (FET) device, the method comprising:
    forming a gate conductor and gate dielectric on an active device area of a semiconductor wafer, said semiconductor wafer including a buried insulating layer formed over a bulk substrate and a semiconductor-on-insulator layer initially formed over said buried insulator layer;
    forming source and drain extensions in said semiconductor-on-insulator layer, adjacent opposing sides of said gate conductor;
    forming source and drain sidewall spacers adjacent said gate conductor;
    removing remaining portions of said semiconductor-on-insulator layer adjacent said sidewall spacers;
    forming additional sidewall spacers adjacent said source and drain sidewall spacers;
    removing exposed portions of said buried insulator layer by a vertical etch thereof, followed by a horizontal, recess etch thereof, so as to expose portions of said bulk substrate, wherein a remaining portion of said buried insulator layer below said gate conductor has a length so as to expose only a bottom surface of said source and drain extensions;
    epitaxially growing a semiconductor layer on said exposed portions of said bulk substrate and said bottom surface of source and drain extensions;
    forming source and drain implants in said epitaxially grown semiconductor layer.

2. The method of claim 1, wherein:
    said bulk substrate comprises silicon;
    said buried insulator further comprises a buried oxide (BOX) layer; and
    said semiconductor-on-insulator layer further comprises a thin silicon-on-insulator (501) layer.

3. The method of claim 2, wherein said epitaxially grown semiconductor layer further comprises one or more of: silicon (Si), silicon germanium (SiGe), silicon carbon (SiC), silicon germanium carbon (SiGeC), germanium (Ge), and combinations thereof.

4. The method of claim 2, further comprising:
    removing a protective nitride cap, previously formed on said gate conductor, following said forming said source and drain implants; and
    forming silicide contacts in said source region, said drain region, and said gate conductor.

* * * * *

UNITED STATES PATENT AND TRADEMARK OFFICE
CERTIFICATE OF CORRECTION

PATENT NO.      : 7,659,172 B2
APPLICATION NO. : 11/164343
DATED           : February 9, 2010
INVENTOR(S)     : Nayfeh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1042 days.

Signed and Sealed this

Thirtieth Day of November, 2010

David J. Kappos
*Director of the United States Patent and Trademark Office*